US009966945B2

(12) United States Patent
Ujita et al.

(10) Patent No.: US 9,966,945 B2
(45) Date of Patent: May 8, 2018

(54) SEMICONDUCTOR DEVICE

(71) Applicant: Panasonic Corporation, Osaka (JP)

(72) Inventors: Shinji Ujita, Osaka (JP); Hiroshi Inada, Osaka (JP); Tatsuo Morita, Tokyo (JP)

(73) Assignee: PANASONIC CORPORATION, Osaka (JP)

( * ) Notice: Subject to any disclaimer, the term of this patent is extended or adjusted under 35 U.S.C. 154(b) by 0 days. days.

(21) Appl. No.: 15/212,126

(22) Filed: Jul. 15, 2016

(65) Prior Publication Data

US 2016/0329890 A1  Nov. 10, 2016

Related U.S. Application Data

(63) Continuation of application No. PCT/JP2015/000842, filed on Feb. 23, 2015.

(30) Foreign Application Priority Data

Feb. 24, 2014 (JP) .................. 2014-033058

(51) Int. Cl.
  H03B 1/00   (2006.01)
  H03K 3/00   (2006.01)
  (Continued)

(52) U.S. Cl.
  CPC ..... *H03K 17/6871* (2013.01); *H01L 23/4824* (2013.01); *H01L 23/5226* (2013.01); *H01L 24/05* (2013.01); *H01L 24/06* (2013.01); *H01L 24/45* (2013.01); *H01L 27/0605* (2013.01); *H01L 27/0883* (2013.01); *H01L 27/095* (2013.01); *H01L 27/098* (2013.01); *H01L 29/2003* (2013.01); *H01L 29/7786* (2013.01); *H02M 3/1588* (2013.01); (Continued)

(58) Field of Classification Search
  CPC .................................................. H03K 17/6871
  USPC ......................................................... 327/109
  See application file for complete search history.

(56) References Cited

U.S. PATENT DOCUMENTS 7,863,877 B2 * 1/2011 Briere ................. H01L 27/0211
                                                    323/222
2008/0136390 A1   6/2008 Briere
(Continued)

FOREIGN PATENT DOCUMENTS

JP   2011-182591   9/2011
JP   2012-526487   10/2012

OTHER PUBLICATIONS

International Search Report of PCT application No. PCT/JP2015/000842 dated Apr. 14, 2015.

*Primary Examiner* — Lincoln Donovan
*Assistant Examiner* — Metasebia Retebo
(74) *Attorney, Agent, or Firm* — McDermott Will & Emery LLP

(57) ABSTRACT

A semiconductor device is provided which realizes speed-up and cost reduction. The semiconductor device has a high side gate driver including a depression type FET and an enhancement type FET, a low side gate driver including a depression type FET and an enhancement type FET, and a high side power FET and a low side power FET as field-effect transistors, in which the high side gate driver, the low side gate driver, the high side power FET and the low side power FET are integrated in the same chip.

14 Claims, 13 Drawing Sheets

(51) Int. Cl.
| | |
|---|---|
| H03K 17/687 | (2006.01) |
| H01L 29/778 | (2006.01) |
| H01L 27/095 | (2006.01) |
| H01L 27/098 | (2006.01) |
| H01L 29/20 | (2006.01) |
| H01L 27/088 | (2006.01) |
| H01L 23/482 | (2006.01) |
| H01L 23/00 | (2006.01) |
| H03K 17/0412 | (2006.01) |
| H03K 17/16 | (2006.01) |
| H01L 27/06 | (2006.01) |
| H02M 3/158 | (2006.01) |
| H01L 23/522 | (2006.01) |
| H01L 29/417 | (2006.01) |
| H01L 29/10 | (2006.01) |

(52) U.S. Cl.
CPC ..... *H03K 17/04123* (2013.01); *H03K 17/162* (2013.01); *H03K 17/6877* (2013.01); *H01L 29/1066* (2013.01); *H01L 29/41758* (2013.01); *H01L 2224/0401* (2013.01); *H01L 2224/04042* (2013.01); *H01L 2224/06051* (2013.01); *H01L 2224/06177* (2013.01); *H01L 2224/131* (2013.01); *H01L 2224/81801* (2013.01); *H01L 2924/00014* (2013.01); *H01L 2924/13055* (2013.01); *H01L 2924/13091* (2013.01); *H02M 3/158* (2013.01); *H03K 2017/6875* (2013.01); *H03K 2217/0063* (2013.01); *H03K 2217/0072* (2013.01); *Y02B 70/1466* (2013.01)

(56) References Cited

U.S. PATENT DOCUMENTS

| | | | |
|---|---|---|---|
| 2010/0283061 A1* | 11/2010 | Kelley | H03K 17/145 |
| | | | 257/77 |
| 2011/0210340 A1 | 9/2011 | Kelley | |
| 2011/0215746 A1* | 9/2011 | Ikoshi | H01L 24/06 |
| | | | 318/400.27 |
| 2013/0241520 A1* | 9/2013 | Kim | H03K 17/687 |
| | | | 323/311 |

* cited by examiner

SEMICONDUCTOR DEVICE

BACKGROUND

1. Technical Field

The present disclosure relates to a semiconductor device.

2. Description of the Related Art

A DC-DC converter for use as a power supply circuit of a personal computer requires more and more current in order to drive a central processing unit at high speed.

A DC-DC converter is configured with a high side switch and a low side switch each using a power semiconductor. Then, by alternately turning on/off the high side switch and the low side switch in synchronization with each other, the DC-DC converter conducts voltage conversion. The high side switch is a control switch of the DC-DC converter and the low side switch is a synchronous rectification switch.

When a high side switch, a low side switch, and a gate driver which drives each of the switches are formed in one package, a parasitic inductance is generated due to wiring-bonding of a semiconductor device, or due to wirings of a printed circuit board of a package in which the components are mounted. In particular, when a main current flows to a parasitic inductance on a source terminal side of the high side switch, an induced electromotive force is generated. As a result, turn-on of the high side switch is delayed to invite a reduction in power conversion efficiency.

Additionally, there is also a concern that an increase in a parasitic inductance among a gate driver, a high side switch and a low side switch may cause a reduction in power conversion efficiency, i.e. an increase in loss.

Therefore, one technique proposed for improving power conversion efficiency of a DC-DC converter is to integrate a high side switch, a low side switch, and a gate driver which drives each of the switches in one chip, thereby reducing an effect of a parasitic inductance caused by wiring-bonding and a package (Patent Literature 1).

According to Patent Literature 1, by integrating each element in one chip, wirings and the like on a packaging board can be removed, thereby reducing the above-described parasitic inductance and reducing a module size.

CITATION LIST

Patent Literature

PTL 1: U.S. Patent Publication No. 2008/0136390

SUMMARY

However, in Patent Literature 1, since two transistors configuring a gate driver are both N-type transistors, when one common switch signal is input to each transistor, the gate driver cannot be alternately turned on/off. Although inputting a switch signal whose phase is different by 180° to each transistor enables alternate on/off of the gate driver, in this case, two integrated circuits (ICs) for generating a switch signal are required. Therefore, this configuration has disadvantages in cost and size.

On the other hand, when a high side transistor of a gate driver is configured with a P-type transistor and a low side transistor is configured with an N-type transistor, just inputting one common switch signal enables alternate on/off of the gate driver. However, with an III-V group compound semiconductor including a nitride semiconductor, it is difficult to realize a high-speed P-type transistor.

Additionally, for realizing a DC-DC converter capable of flowing a large current, a gate width (Wg) of each of two power transistors configuring the gate driver should be increased, so that a size of the power transistor is increased. As a result, even when a switch configured with a power transistor and a gate driver are connected by wirings in a chip, a large parasitic inductance is added to invite a problem that a specific layout of higher-order wirings is required.

In view of the above problems, the present disclosure aims at providing a semiconductor device which realizes speed-up and cost reduction.

A semiconductor device according to one aspect of the present disclosure has a first gate driver and a second gate driver each including a depression type transistor as a field-effect transistor and a first enhancement type transistor as a field-effect transistor, and a first power transistor and a second power transistor as field-effect transistors. A source terminal of the first power transistor and a drain terminal of the second power transistor are connected. A drain terminal of the first power transistor is connected to a power supply. A source terminal of the second power transistor is grounded. An output terminal of the first gate driver is connected to a gate terminal of the first power transistor. A ground terminal of the first gate driver is connected to the source terminal of the first power transistor. An output terminal of the second gate driver is connected to a gate terminal of the second power transistor. A ground terminal of the second gate driver is connected to the source terminal of the second power transistor. The first gate driver, the second gate driver, the first power transistor and the second power transistor are integrated in the same chip.

This configuration enables the gate driver to be turned on/off by one switch signal by using the depression type transistor and the enhancement type transistor in each of the first gate driver and the second gate driver. As a result, a circuit area can be decreased to reduce cost. Additionally, speed-up can be realized because use of a P-type transistor is not required.

For example, in each of the first gate driver and the second gate driver, connection may be as follows. A drain terminal of the depression type transistor is connected to the power supply. Further, a gate terminal and a source terminal of the depression type transistor, and a drain terminal of the first enhancement type transistor are connected to the output terminal. A source terminal of the first enhancement type transistor is connected to the ground terminal.

For example, the first gate driver and the second gate driver each further include a second enhancement type transistor and a third enhancement type transistor, and in each of the first gate driver and the second gate driver, connection may be as follows. A drain terminal of the depression type transistor is connected to the power supply. Further, a gate terminal and a source terminal of the depression type transistor, a drain terminal of the first enhancement type transistor, and a gate terminal of the second enhancement type transistor are connected with each other. Further, a gate terminal of the third enhancement type transistor and a gate terminal of the first enhancement type transistor are connected. Further, a source terminal of the second enhancement type transistor and a drain terminal of the third enhancement type transistor are connected to the output terminal. Further, a drain terminal of the second enhancement type transistor is connected to the power supply. Further, a source terminal of the first enhancement type transistor and a source terminal of the third enhancement type transistor may be connected to the ground terminal.

By reducing a gate width of each of the depression type transistor and the first enhancement type transistor and increasing a gate width of each of the second enhancement type transistor and the third enhancement type transistor, this configuration enables suppression of power consumption while increasing an output current.

For example, the semiconductor device may include a semiconductor layer laminate, and a first gate electrode, a first source electrode and a first drain electrode of the depression type transistor which are formed on the semiconductor layer laminate. Further provided are a second gate electrode, a second source electrode and a second drain electrode of the first enhancement type transistor which are formed on the semiconductor layer laminate. Further provided is a first insulation layer formed on the first gate electrode, the first source electrode, the first drain electrode, the second gate electrode, the second source electrode and the second drain electrode. Further provided are a first wiring layer formed on the first insulation layer, and a plurality of first via holes which are formed on the first insulation layer and which connect the first gate electrode, the first source electrode, the first drain electrode, the second gate electrode, the second source electrode and the second drain electrode with the first wiring layer. Further provided are a second insulation layer formed on the first wiring layer, a second wiring layer formed on the second insulation layer, and a plurality of second via holes which are formed in the second insulation layer and which connect the first wiring layer with the second wiring layer.

For example, each of the first gate driver and the second gate driver may include a signal input pad connected to the gate terminal of the first enhancement type transistor, and a power application pad connected to the drain terminal of the depression type transistor. Further provided may be a signal output wiring formed using the first wiring layer and corresponding to the output terminal, and a source terminal wiring formed using the first wiring layer and corresponding to the ground terminal.

For example, the semiconductor device may be configured as follows. The first power transistor further includes a third gate electrode, a third source electrode and a third drain electrode which are formed on the semiconductor layer laminate. Further provided is a first drain lift-up wiring formed using the first wiring layer and connected to the third drain electrode via any of the plurality of first via holes. Further provided is a first source lift-up wiring formed using the first wiring layer and connected to the third source electrode via any of the plurality of first via holes. Further provided is a first gate lift-up wiring formed using the first wiring layer and connected to the third gate electrode via any of the plurality of first via holes. The first drain lift-up wiring and the first source lift-up wiring extend in parallel to each other in a first direction, and the first gate lift-up wiring is formed so as to surround the first drain lift-up wiring and the first source lift-up wiring. The first power transistor further includes a plurality of first drain electrode pads formed using the second wiring layer and connected to the first drain lift-up wiring via any of the plurality of second via holes, and a plurality of first source electrode pads formed using the second wiring layer and connected to the first source lift-up wiring via any of the plurality of second via holes. Further, the plurality of first drain electrode pads and the plurality of first source electrode pads are alternately disposed side by side in the first direction. The second power transistor includes a fourth gate electrode, a fourth source electrode and a fourth drain electrode which are formed on the semiconductor layer laminate. Further provided are a second drain lift-up wiring formed using the first wiring layer and connected to the fourth drain electrode via any of the plurality of first via holes, and a second source lift-up wiring formed using the first wiring layer and connected to the fourth source electrode via any of the plurality of first via holes. Further provided is a second gate lift-up wiring formed using the first wiring layer and connected to the fourth gate electrode via any of the plurality of first via holes. Further, the second drain lift-up wiring and the second source lift-up wiring extend in parallel to each other in the first direction, and the second gate lift-up wiring is formed so as to surround the second drain lift-up wiring and the second source lift-up wiring. The second power transistor further includes a plurality of second drain electrode pads formed using the second wiring layer and connected to the second drain lift-up wiring via any of the plurality of second via holes. Further provided are a plurality of second source electrode pads formed using the second wiring layer and connected to the second source lift-up wiring via any of the plurality of second via holes. Further, the plurality of second drain electrode pads and the plurality of second source electrode pads are alternately disposed side by side in the first direction. Further, the plurality of first source electrode pads correspond to the plurality of second drain electrode pads on one-to-one basis, the corresponding first source electrode pad and second drain electrode pad being connected to configure a single first drain/source electrode pad.

This configuration allows an electrode pad to be formed on a device. As a result, a chip size can be reduced to enable cost reduction.

For example, the semiconductor device may be configured as follows. The signal output wiring of the first gate driver is connected to the first gate lift-up wiring, and the source terminal wiring of the first gate driver is connected to the first source lift-up wiring. Further, the signal output wiring of the second gate driver is connected to the second gate lift-up wiring, and the source terminal wiring of the second gate driver is connected to the second source lift-up wiring.

This configuration enables connection between the signal output wiring of the gate driver and the gate lift-up wiring of the power transistor and connection between the source terminal wiring of the gate driver and the source lift-up wiring of the power transistor by using the first wiring layer. As a result, a parasitic inductance added between the gate driver and the power transistor can be suppressed to realize speed-up.

For example, the semiconductor device may be configured as follows. Among the plurality of first drain electrode pads and a plurality of the first drain/source electrode pads, a first electrode pad disposed at a position closest to the first gate driver is the first drain electrode pad. The semiconductor device is further formed using the second wiring layer at a position closer to the first gate driver than the first electrode pad. Further provided are a source additional wiring connected to the first source lift-up wiring via any of the second via holes, and a second drain/source electrode pad formed using the second wiring layer and connected to the source additional wiring.

In this configuration, it is possible to make, as small as possible, a size of the first drain electrode pad on the first power transistor and closest to the first gate driver and to form a source additional wiring connected to the first source lift-up wiring in a free space. This enables further suppression of a parasitic inductance added to the source terminal of the first gate driver.

For example, the semiconductor device may be configured as follows. Among the plurality of first drain electrode pads and a plurality of the first drain/source electrode pads, a first electrode pad disposed at a position closest to the first gate driver is the first drain/source electrode pad. Further, among the plurality of second source electrode pads and the plurality of first drain/source electrode pads, an electrode pad disposed at a position closest to the second gate driver is the first drain/source electrode pad as the first electrode pad. Further, the first electrode pad on the first power transistor has a width in the first direction larger than a width of the first electrode pad on the second power transistor and is formed using the second wiring layer at a position closer to the second gate driver than the first electrode pad. Further provided are a source additional wiring connected to the second source lift-up wiring via any of the second via holes, and a third source electrode pad formed using the second wiring layer and connected to the source additional wiring.

In this configuration, it is possible to make, as small as possible, a size of the second drain electrode pad on the second power transistor and closest to the second gate driver and to form a source additional wiring connected to the second source lift-up wiring in a free space. This enables further suppression of a parasitic inductance added to the source terminal of the second gate driver.

For example, the semiconductor device may further include a fourth source electrode pad formed using the second wiring layer and connected to the third source electrode pad via the source additional wiring.

For example, the signal output wiring of the first gate driver may be connected to the first gate lift-up wiring, and the signal output wiring of the second gate driver may be connected to the second gate lift-up wiring.

For example, the semiconductor device may be configured as follows. Among the plurality of first drain electrode pads and the plurality of first drain/source electrode pads, a first electrode pad disposed at a position closest to the first gate driver is the first drain/source electrode pad. Further, the source terminal wiring of the first gate driver is connected to the first source lift-up wiring via the first electrode pad.

The semiconductor device may be configured as follows. For example, among the plurality of second source electrode pads and the plurality of first drain/source electrode pads, a second electrode pad disposed at a position closest to the second gate driver is the second source electrode pad. The source terminal wiring of the second gate driver is connected to the second source lift-up wiring via the second electrode pad.

For example, the depression type transistor, the first enhancement type transistor, the first power transistor and the second power transistor may be each configured with a nitride semiconductor.

For example, the semiconductor device may further include a p-type semiconductor layer formed between the second gate electrode and the semiconductor layer laminate.

The present disclosure provides a semiconductor device enabling speed-up and cost reduction.

DETAILED DESCRIPTION

In the following, a semiconductor device according to exemplary embodiments will be described with reference to the drawings. Exemplary embodiments to be described in the following each show one specific example of the present disclosure. Numerical values, shapes, materials, components, arrangement positions and connection forms of the components, the order of steps and the like shown in the following exemplary embodiments are illustrated only by way of example and do not limit the present disclosure. Additionally, among the components in the following exemplary embodiments, a component not recited in an independent claim showing the highest-order concept will be described as an arbitrary component.

First Exemplary Embodiment

Figure 1A:
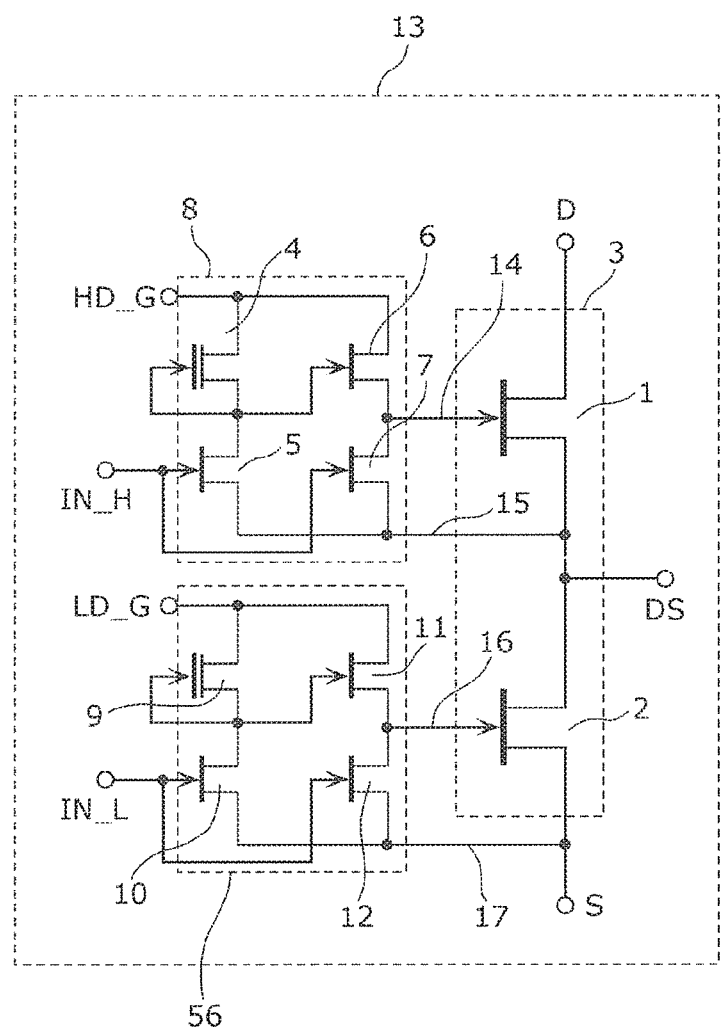
FIG. 1A is a circuit diagram of a semiconductor device according to a first exemplary embodiment.

FIG. 1A is a circuit diagram of a DC-DC converter, which is a semiconductor device 13 according to the present exemplary embodiment. This circuit configuration shows a case, as one example, where a field-effect transistor formed with a nitride semiconductor is used.

Semiconductor device 13 according to the present exemplary embodiment includes power device stage 3 having a half-bridge configuration, high side gate driver 8 (a first gate driver) and low side gate driver 56 (a second gate driver).

Power device stage 3 includes high side power FET (field-effect transistor) 1 (first power transistor) and low side power FET 2 (second power transistor). A drain terminal D of high side power FET 1 is connected to a power supply (not shown) and a source terminal S of low side power FET 2 is connected to a ground (not shown) (grounded).

High side gate driver 8 includes depression type FET 4 (depression type transistor), and enhancement type FETs 5, 6 and 7 (first to third enhancement type transistors).

A drain terminal of depression type FET 4 and a drain terminal of enhancement type FET 6 are connected to a power supply for supplying a predetermined voltage (HD_G terminal). A gate terminal and a source terminal of depression type FET 4, a drain terminal of enhancement type FET 5, and a gate terminal of enhancement type FET 6 are connected to each other.

A source terminal of enhancement type FET 6 and a drain terminal of enhancement type FET 7 are connected to a gate terminal of high side power FET 1 via wiring 14 (an output terminal of high side gate driver 8). A high side pulse signal (IN_H terminal) is input to a gate terminal of enhancement type FET 5 and a gate terminal of enhancement type FET 7. A source terminal of enhancement type FET 5 and a source terminal of enhancement type FET 7 are connected to a source terminal of high side power FET 1 and a drain terminal of low side power FET 2 via a wiring 15 (a ground terminal of high side gate driver 8).

Low side gate driver 56 includes depression type FET 9 (depression type transistor), and enhancement type FETs 10, 11 and 12 (first to third enhancement type transistors).

A drain terminal of depression type FET 9 and a drain terminal of enhancement type FET 11 are connected to a power supply for supplying a predetermined voltage (LD_G terminal). A gate terminal and a source terminal of depression type FET 9, a drain terminal of enhancement type FET 10, and a gate terminal of enhancement type FET 11 are connected to each other. A source terminal of enhancement type FET 11 and a drain terminal of enhancement type FET 12 are connected to a gate terminal of low side power FET 2 via wiring 16 (an output terminal of low side gate driver 56). A low side pulse signal (IN_L terminal) is input to gate terminal of enhancement type FET 10 and a gate terminal of enhancement type FET 12. A source terminal of enhancement type FET 10 and a source terminal of enhancement type FET 12 are connected to the source terminal (ground) of low side power FET 2 via wiring 17 (a ground terminal of low side gate driver 56).

Depression type FETs 4 and 9, enhancement type FETs 5 to 7 and 10 to 12, high side power FET 1 and low side power FET 2 are each configured with, for example, a nitride semiconductor.

The above components are integrated on the same substrate (in the same chip). In other words, semiconductor device 13 is a one chip DC-DC converter.

Figure 1B:
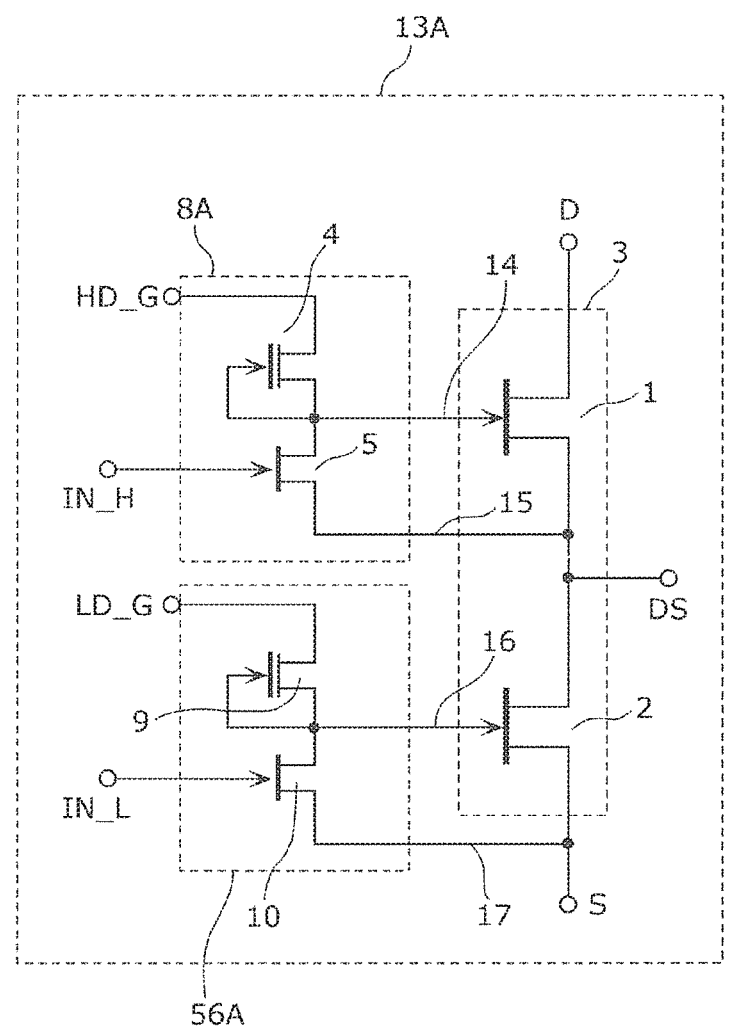
FIG. 1B is a circuit diagram of another example of the semiconductor device according to the first exemplary embodiment.

Similarly to semiconductor device 13A as shown in FIG. 1B, among the above components, high side gate driver 8A may include only depression type FET 4 and enhancement type FET 5, and low side gate driver 56A may include only depression type FET 9 and enhancement type FET 10. In this case, a terminal to which a gate terminal and a source terminal of depression type FET 4, and a drain terminal of enhancement type FET 5 are connected is connected to wiring 14, and a terminal to which a gate terminal and a source terminal of depression type FET 9, and a drain terminal of enhancement type FET 10 are connected is connected to wiring 16.

However, since high side power FET 1 and low side power FET 2 have a large gate width (Wg) so as to be driven by a large current, a gate charge capacitance is large as well. For driving this DC-DC converter at high speed, time for electric charges to stay in a gate charge capacitance should be shortened and therefore an output current from the gate driver should be large.

A circuit configuration including only depression type FET 4 and enhancement type FET 5 is generally called Direct Coupled FET Logic (DCFL). For increasing an output current only with this configuration, a Wg of depression type FET 4 should be also increased. Since depression type FET 4 is of a depression type, in this circuit configuration in which the gate terminal and the source terminal of depression type FET 4 are short-circuited, current constantly flows regardless of whether a pulse signal input from an IN_H terminal is on or off. As a result, power consumption is extremely increased. Therefore, high side gate driver 8 preferably includes a buffer amplifier having a half-bridge configuration formed with enhancement type FETs 6 and 7, and low side gate driver 56 preferably includes a buffer amplifier having a half-bridge configuration formed with enhancement type FETs 11 and 12. It is possible to increase an output current by increasing a Wg of an FET of a buffer amplifier and to suppress power consumption of a gate driver as a whole by reducing a Wg of an FET in a DCFL part. In the circuit configuration shown in FIG. 1A, only a one-stage buffer amplifier is used; however, a two- or more-stage buffer amplifier may be used.

Figure 2:
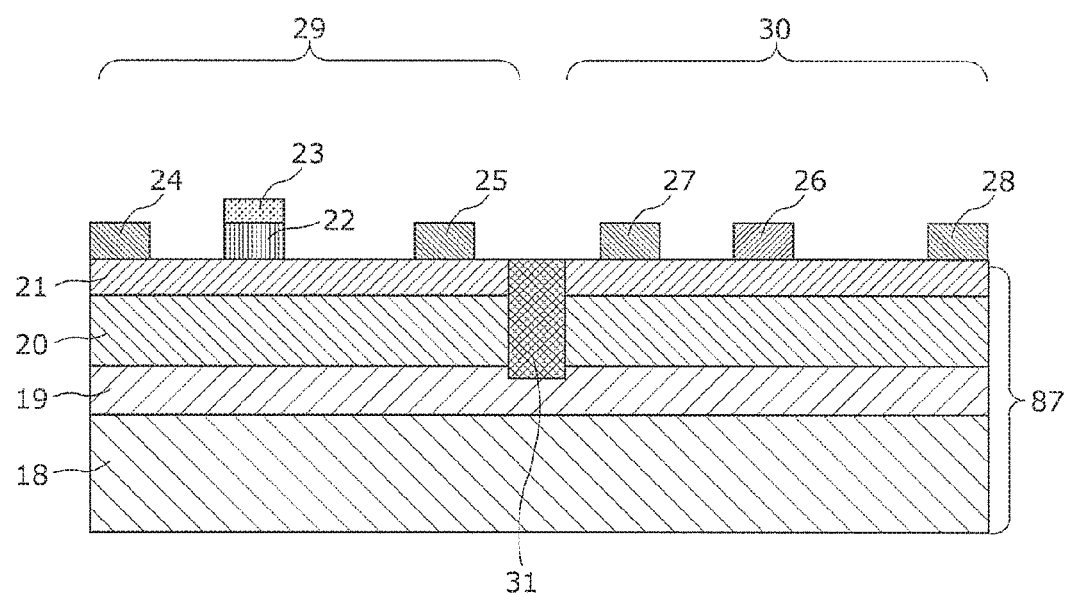
FIG. 2 is a sectional view of a field-effect transistor (FET) according to the first exemplary embodiment.

FIG. 2 is a view showing a sectional structure of a device for realizing the present exemplary embodiment. This device structure simultaneously includes depression type FET 30 and enhancement type FET 29. Here, depression type FET 30 corresponds to the above-described depression type FETs 4 and 9, and enhancement type FET 29 corresponds to enhancement type FETs 5 to 7 and 10 to 12, and high side power FET 1 and low side power FET 2.

Buffer layer 19 made of aluminium nitride (AlN) and having a thickness of 100 nm is formed on a conductive Si substrate 18 made of silicon (Si). On the layer, first layer 20 made of undoped gallium nitride (GaN) and having a thickness of 1 μm to 2 μm and second layer 21 made of undoped aluminum gallium nitride (AlGaN) and having a thickness of 10 nm to 20 nm are laminated. In the vicinity of a hetero interface between first layer 20 and second layer 21, spontaneous polarization and piezoelectric polarization cause generation of electric charges. As a result, a channel region is generated which is a two-dimensional electron gas (2DEG) layer with a sheet carrier concentration of $1 \times 10^{13}$ $cm^{-2}$ or higher and a mobility of 1000 $cm^2$ V/sec or higher. In the following, Si substrate 18 to second layer 21 are referred to as semiconductor layer laminate 87.

Gate electrode 23 (second gate electrode), source electrode 24 (second source electrode) and drain electrode 25 (second drain electrode) configuring enhancement type FET 29, and gate electrode 26 (first gate electrode), source electrode 27 (first source electrode) and drain electrode 28 (first drain electrode) configuring depression type FET 30 are formed on semiconductor layer laminate 87. Drain electrodes 25 and 28 and source electrodes 24 and 27 are made of laminated titanium (Ti) and aluminum (Al) and are in ohmic contact with the channel region.

In a region between drain electrode 25 and source electrode 24 on second layer 21, gate electrode 23 is formed via p-type nitride semiconductor layer 22. Gate electrode 23 is made of laminated palladium (Pd) and gold (Au) and is in ohmic contact with p-type nitride semiconductor layer 22.

P-type nitride semiconductor layer 22 has a thickness of 100 nm to 300 nm and is made of AlGaN doped with magnesium (Mg). P-type nitride semiconductor layer 22 and second layer 21 form a PN junction. As a result, even when a voltage to be applied to the gate electrode is 0 V, a depletion layer is formed in second layer 21 and first layer 20 from p-type nitride semiconductor layer 22 toward Si substrate 18 and toward source electrode 24 or drain electrode 25. Accordingly, even when a voltage to be applied to gate electrode 23 is 0 V, current flowing through the channel region is cut off to realize normally-off operation. In other words, an enhancement type FET is realized.

Additionally, when a gate voltage of 3 V or higher which exceeds a built-in potential of the PN junction is applied to gate electrode 23, positive holes can be injected into the channel region. Since in a nitride semiconductor, a mobility of positive holes is far lower than a mobility of electrons, positive holes injected into the channel region barely make a contribution as a carrier which makes current flow. Accordingly, the injected positive holes make as many electrons as the positive holes be generated in the channel region and perform a function as a donner ion which improves an effect of generating electrons in the channel region. In other words, a carrier concentration can be modulated in the channel region, thereby realizing a normally-off type power semiconductor element with a large operating current and a low resistance.

Gate electrode 26 is a metal electrode which includes laminated gold (Au) of low resistance or the like and which is formed between source electrode 27 and drain electrode 28, and is in Schottky contact with second layer 21. Isolation layer 31 is formed by ion injection or the like so as to prevent the respective FETs from interfering with each other.

Figure 3:
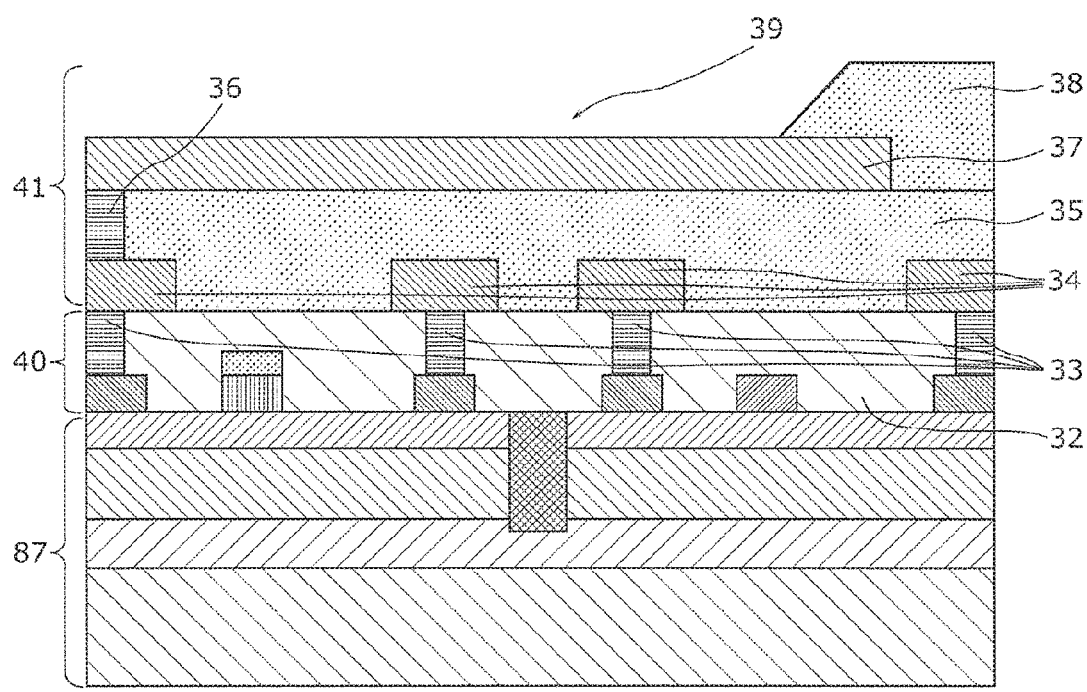
FIG. 3 is a sectional view of the semiconductor device according to the first exemplary embodiment.

FIG. 3 is a view showing a sectional structure of higher-order wirings on the device. Dielectric layer 32 (first insulation layer) is deposited on the electrodes for FETs formed on semiconductor layer laminate 87 as shown in FIG. 2. Dielectric layer 32 is made, for example, of silicon nitride (SiN). On dielectric layer 32, primary thick film wiring 34 (first wiring layer) is formed. Primary thick film wiring 34 and each electrode of the FET are connected via via hole 33 (first via hole).

Dielectric layer 35 (second insulation layer) which can be thickened is deposited on primary thick film wiring 34. Dielectric layer 35 is made, for example, of polybenzoxazole (PBO) or benzocyclobute (BCB) which can be thickened and has a low relative dielectric constant. On dielectric layer 35, secondary thick film wiring 37 (second wiring layer) is formed which is connected to primary thick film wiring 34 via via hole 36 (second via hole).

Dielectric layer 38 is deposited on secondary thick film wiring 37. For example, dielectric layer 38 is made of the same material as dielectric layer 35. Dielectric layer 38 on secondary thick film wiring 37 is formed with an opening which part functions as pad 39. Additionally, as shown in FIG. 3, a layer including dielectric layer 32 and elements configured therein is referred to as thin film wiring layer 40, and a layer including dielectric layers 35 and 38 and elements configured therein is referred to as thick film wiring layer 41.

Figure 4:
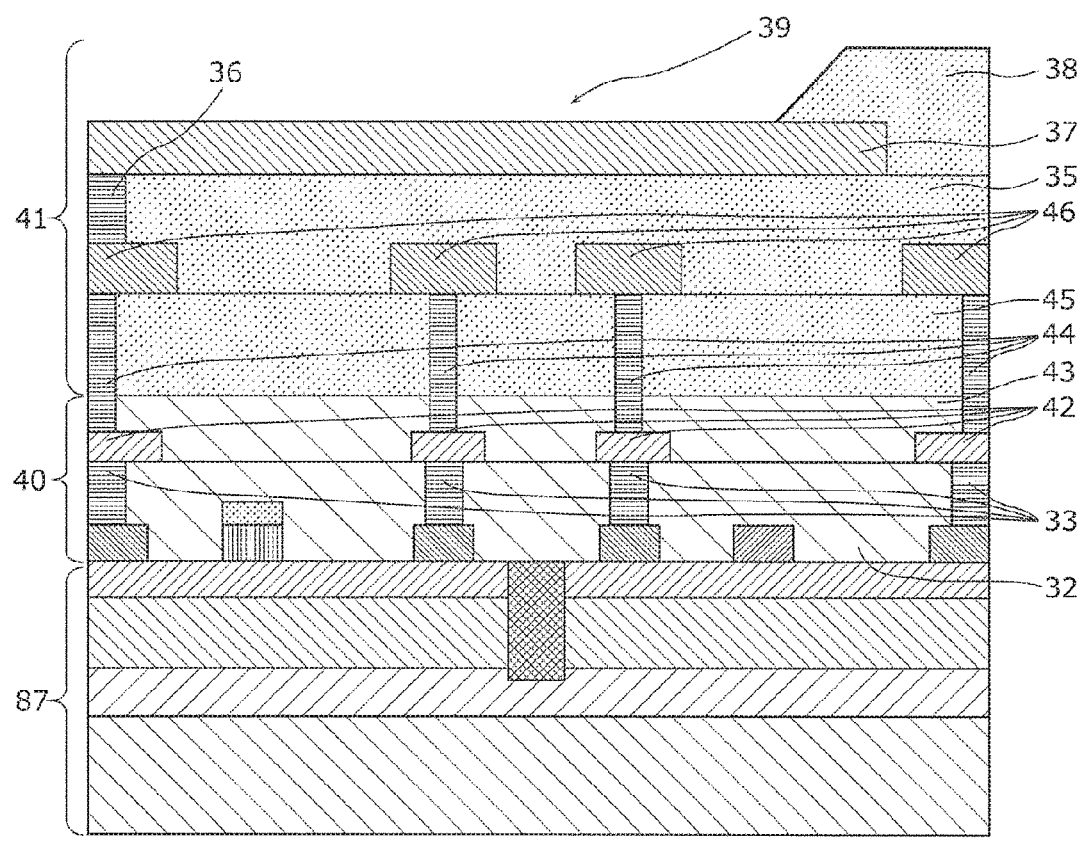
FIG. 4 is a sectional view of another example of the semiconductor device according to the first exemplary embodiment.

FIG. 4 is a view showing a modification example of a sectional structure of higher-order wirings on the device. The same components as those in the sectional structure of the higher-order wirings on the device shown in FIG. 3 are given the same reference numerals to omit description thereof.

Thin film additional wiring 42 is formed on dielectric layer 32. Each electrode of the FET and thin film additional wiring 42 are connected via via hole 33. Reasons for insertion of thin film additional wiring 42 include use of thin film additional wiring 42 as bridge wiring in a minute part which cannot be realized by higher-order wirings of thick film wiring layer 41 due to constraints on a wiring width, a wiring interval and the like, and use of thin film additional wiring 42 as laminated wiring in order to reduce a wiring resistance of each electrode.

On thin film additional wiring 42, dielectric layer 43 made, for example, of SiN is deposited. Further on the layer, thick film thick dielectric layer 45 is deposited. On thick film dielectric layer 45, primary thick film wiring 46 is formed, and primary thick film wiring 46 and thin film additional wiring 42 are connected via via hole 44.

Figure 5A:
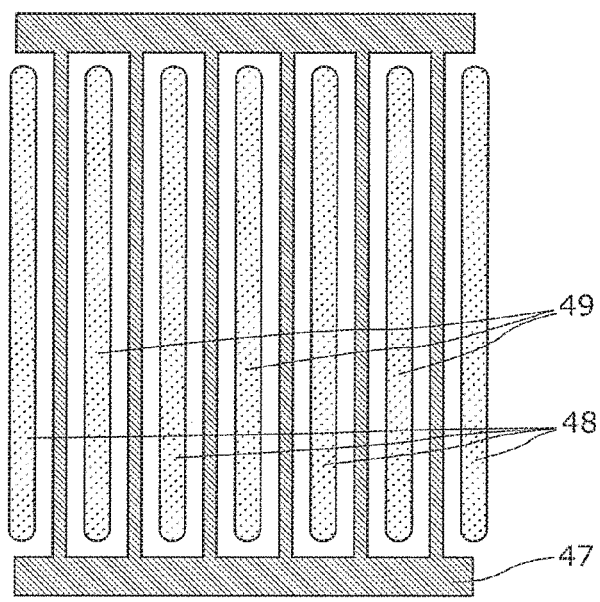
FIG. 5A is a plan view of the FET according to the first exemplary embodiment.
Figure 5B:
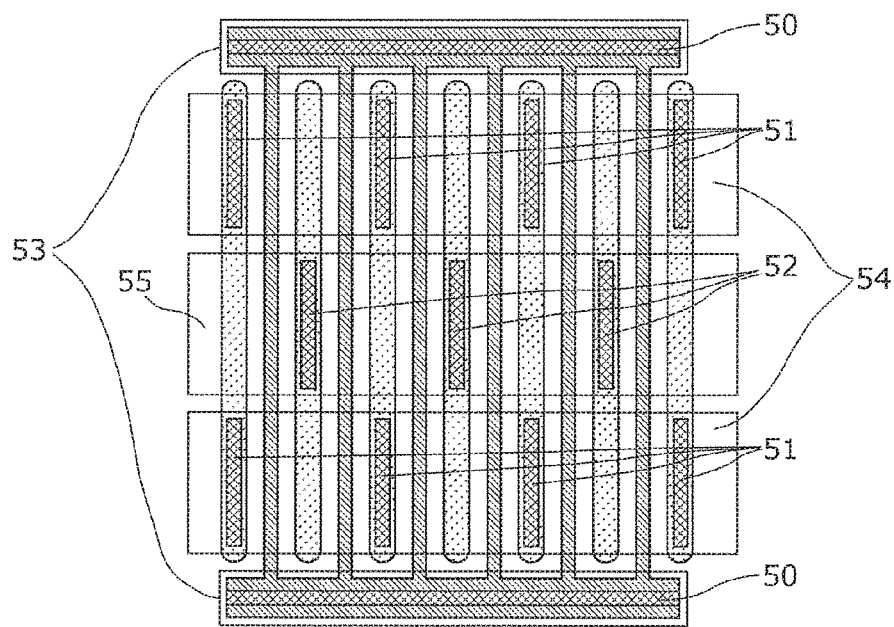
FIG. 5B is a plan view of the FET according to the first exemplary embodiment.

FIG. 5A and FIG. 5B are views showing a plane layout of the FET (depression type FET 30 or enhancement type FET 29). FIG. 5A shows a layout of a part of electrodes in thin film wiring layer 40 (illustration of thin film additional wiring 42 is omitted), and FIG. 5B shows a layout of thick film wiring layer 41 as far as primary thick film wiring 34. As shown in FIG. 5A, gate electrode 47, source electrode 48 and drain electrode 49 extend in the same direction, and gate electrode 47, and source electrode 48 or drain electrode 49 are alternately disposed. Gate electrode 47 is of a ladder type in which both ends of the respective electrodes are all connected in order to reduce a gate resistance.

Additionally, as shown in FIG. 5B, gate lift-up wiring 53 is connected to gate electrode 47 at the part connecting the both ends of gate electrode 47 via via hole 50. Source lift-up wiring 54 is connected to source electrode 48 via via hole 51, and drain lift-up wiring 55 is connected to drain electrode 49 via via hole 52. Although in FIG. 5B, two source lift-up wirings 54 are provided, and one drain lift-up wiring 55 is provided, the number of each wiring is arbitrary. This can be realized by changing the number and arrangement of via holes 51 and 52.

Figure 6A:
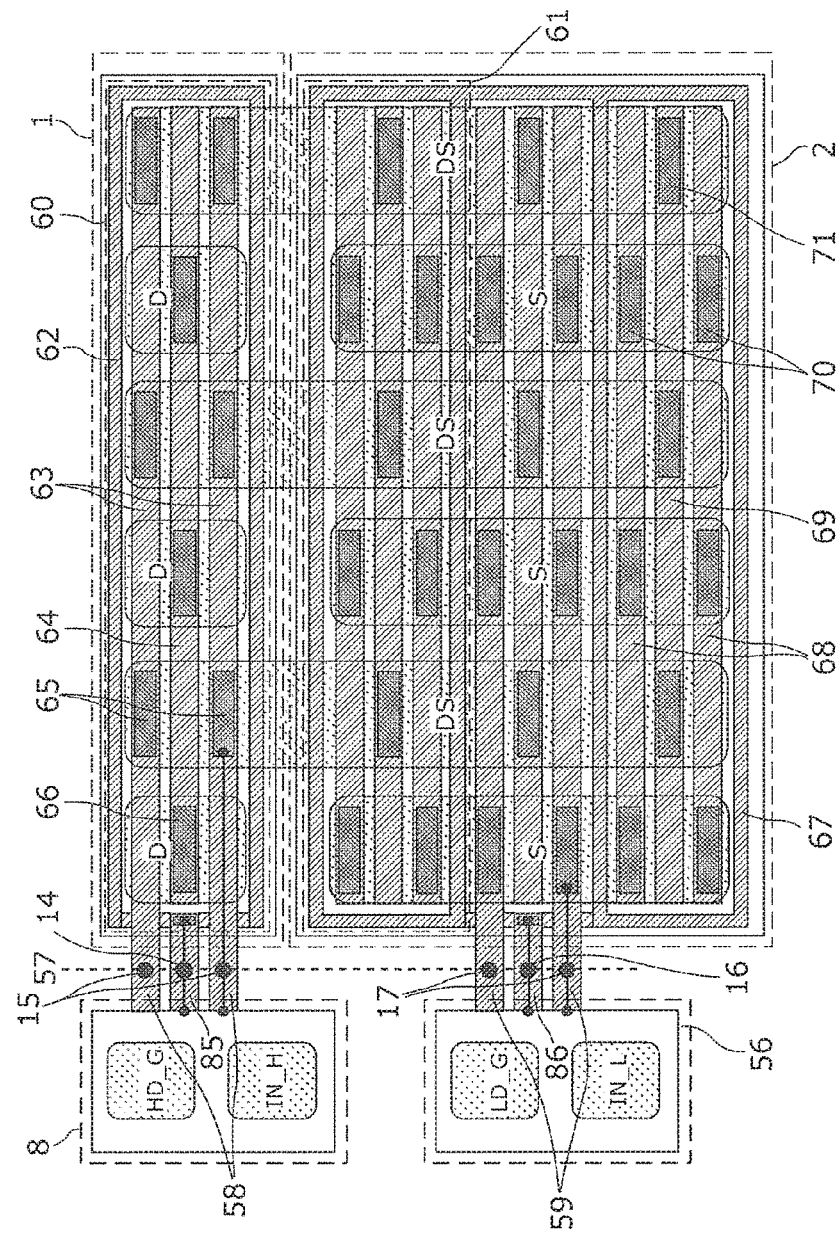
FIG. 6A is a plan view of the semiconductor device according to the first exemplary embodiment.

FIG. 6A is a view showing a specific layout configuration of the semiconductor device according to the present exemplary embodiment. High side power FET 1 is disposed on the right of high side gate driver 8, low side gate driver 56 is disposed below high side gate driver 8 and low side power FET 2 is disposed on the right of low side gate driver 56. High side power FET 1 and low side power FET 2 have, for example, the same lateral width. High side power FET 1 and low side power FET 2 are disposed as close as possible (e.g. on the order of 20 μm).

For high side power FET 1 and low side power FET 2, the structures shown in FIG. 5A and FIG. 5B are used. According to a Wg of the power FET, a plurality of the units shown in FIGS. 5A and 5B are arranged in a vertical direction (downward direction in FIGS. 5A and 5B). In the present exemplary embodiment, high side power FET 1 includes one unit 60 and low side power FET 2 includes three units 61.

High side power FET 1 has gate lift-up wiring 62 (first gate lift-up wiring) connected to the gate electrode (third gate electrode) of high side power FET 1, and source lift-up wiring 63 (first source lift-up wiring) connected to the source electrode (third source electrode) of high side power FET 1. FET 1 further has drain lift-up wiring 64 (first drain lift-up wiring) connected to the drain electrode (third drain electrode) of high side power FET. These are formed using primary thick film wiring 34.

Drain lift-up wiring 64 is connected to a drain electrode pad D (first drain electrode pad) via via hole 66. Source lift-up wiring 63 is connected to a drain/source electrode pad DS (first source electrode pad) via via hole 65. Additionally, the drain electrode pad D and the drain/source electrode pad DS are formed using secondary thick film wiring 37 and are alternately disposed side by side in a lateral direction (first direction).

Drain lift-up wiring 64 and source lift-up wiring 63 extend in parallel to each other in the lateral direction (first direction).

Gate lift-up wiring 62 is formed so as to surround drain lift-up wiring 64 and source lift-up wiring 63. Additionally, among the four sides of gate lift-up wiring 62, on one side closest to high side gate driver 8, the lift-up wiring is removed and only the gate electrode formed with the thin film wiring layer is disposed.

Low side power FET 2 has gate lift-up wiring 67 (second gate lift-up wiring) connected to the gate electrode (fourth gate electrode) of low side power FET 2, and source lift-up wiring 68 (second source lift-up wiring) connected to the source electrode (fourth source electrode) of low side power FET 2. FET 2 further has drain lift-up wiring 69 (second drain lift-up wiring) connected to the drain electrode (fourth drain electrode) of low side power FET 2. These are formed using primary thick film wiring 34.

Drain lift-up wiring 69 is connected to a drain/source electrode pad DS (second drain electrode pad) via via hole 71. Here, drain/source electrode pads DS (first drain/source electrode pads) of high side power FET 1 and low side power FET 2 are connected with each other by secondary thick film wiring 37 so as to be shared. In other words, a plurality of first source electrode pads correspond to a plurality of second drain electrode pads on one-to-one basis, and the corresponding first source electrode pad and second drain electrode pad are connected to configure a single first drain/source electrode pad.

Source lift-up wiring 68 is connected to a source electrode pad S via via hole 70. Additionally, the source electrode pad S and the drain/source electrode pad DS are formed using secondary thick film wiring 37 and alternately disposed side by side in the lateral direction (the first direction).

Drain lift-up wiring 69 and source lift-up wiring 68 extend in parallel to each other in the lateral direction (the first direction).

Gate lift-up wiring 67 is formed so as to surround drain lift-up wiring 69 and source lift-up wiring 68. Additionally, among the four sides of gate lift-up wiring 67, on one side of a unit (unit at the center) closest to low side gate driver 56, the lift-up wiring is removed and only the gate electrode formed with the thin film wiring layer is disposed.

Power device substrate packaging method is preferably flip-chip mounting using a bump by soldering or the like rather than wiring-bonding having a large parasitic inductance. Use of flip-chip mounting enables drastic suppression of a parasitic inductance between the respective electrodes formed on the substrate. In a case of flip-chip mounting, each pad opening width is, for example, on the order of 200 μm or greater, and a pad opening interval is on the order of 100 μm or greater. Each electrode pad opening is formed inside each electrode pad.

On high side gate driver 8, a drain electrode pad HD_G (power application pad) and a pulse signal input pad IN_H (signal input pad) are formed. Additionally, output terminal 85 (signal output wiring) and source terminal 58 (source terminal wiring) of high side gate driver 8 are formed using primary thick film wiring 34 (or 46).

On low side gate driver 56, a drain electrode pad LD_G (power application pad) and a pulse signal input pad IN_L (signal input pad) are formed. Additionally, output terminal 86 (signal output wiring) and source terminal 59 (source terminal wiring) of low side gate driver 56 are formed using primary thick film wiring 34 (or 46).

On boundary 57 between a gate driver region and a power FET region, output terminal 85 of high side gate driver 8 is connected to a part of gate lift-up wiring 62 formed only with the thin film wiring layer. Since output terminal 85 and the thin film wiring have different wiring layers, they are connected via via hole 33. Source terminal 58 of high side gate driver 8 is connected to source lift-up wiring 63.

Output terminal 86 of low side gate driver 56 is connected to a part of gate lift-up wiring 67 formed only with the thin film wiring layer. Since output terminal 86 and the thin film wiring have different wiring layers, they are connected via via hole 33. Source terminal 59 of low side gate driver 56 is connected to source lift-up wiring 68.

Figure 6B:
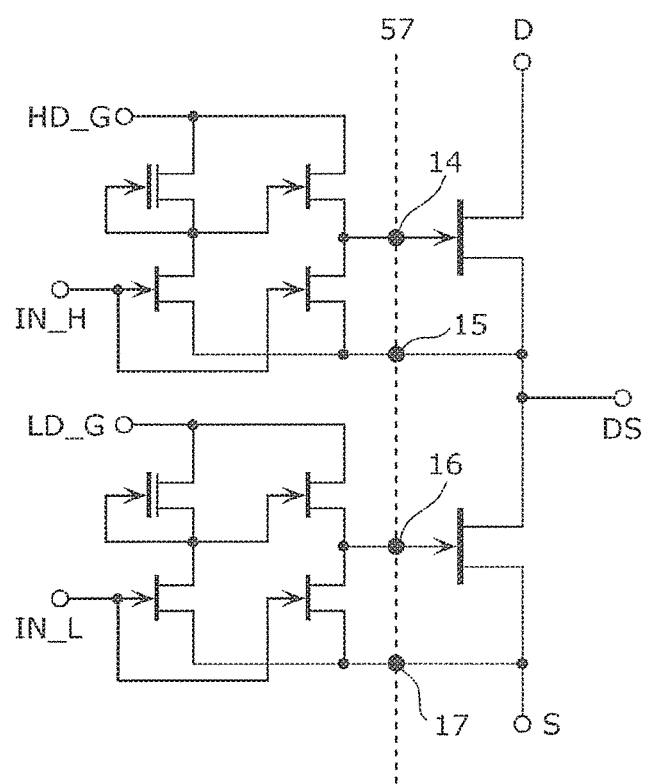
FIG. 6B is a circuit diagram of the semiconductor device according to the first exemplary embodiment.

Additionally, the same numbers as wiring 14, wiring 15, wiring 16 and wiring 17 in the circuit diagram shown in FIG. 6B are also shown in the view of the layout (FIG. 6A). The gate driver region and the power FET region are connected on boundary 57 via wiring 14, wiring 15, wiring 16 and wiring 17. As can be seen in the view of the layout, while wirings 14, 16 and 17 can be formed in the shortest length in integration on one chip, wiring 15 should extend as far as the drain/source electrode pad DS passing through the drain electrode pad D. Therefore, a parasitic inductance remains in wiring 15.

Modification Example of First Exemplary Embodiment

In the following, a semiconductor device according to a modification example of the first exemplary embodiment will be described with reference to the accompanying drawings.

Figure 7:
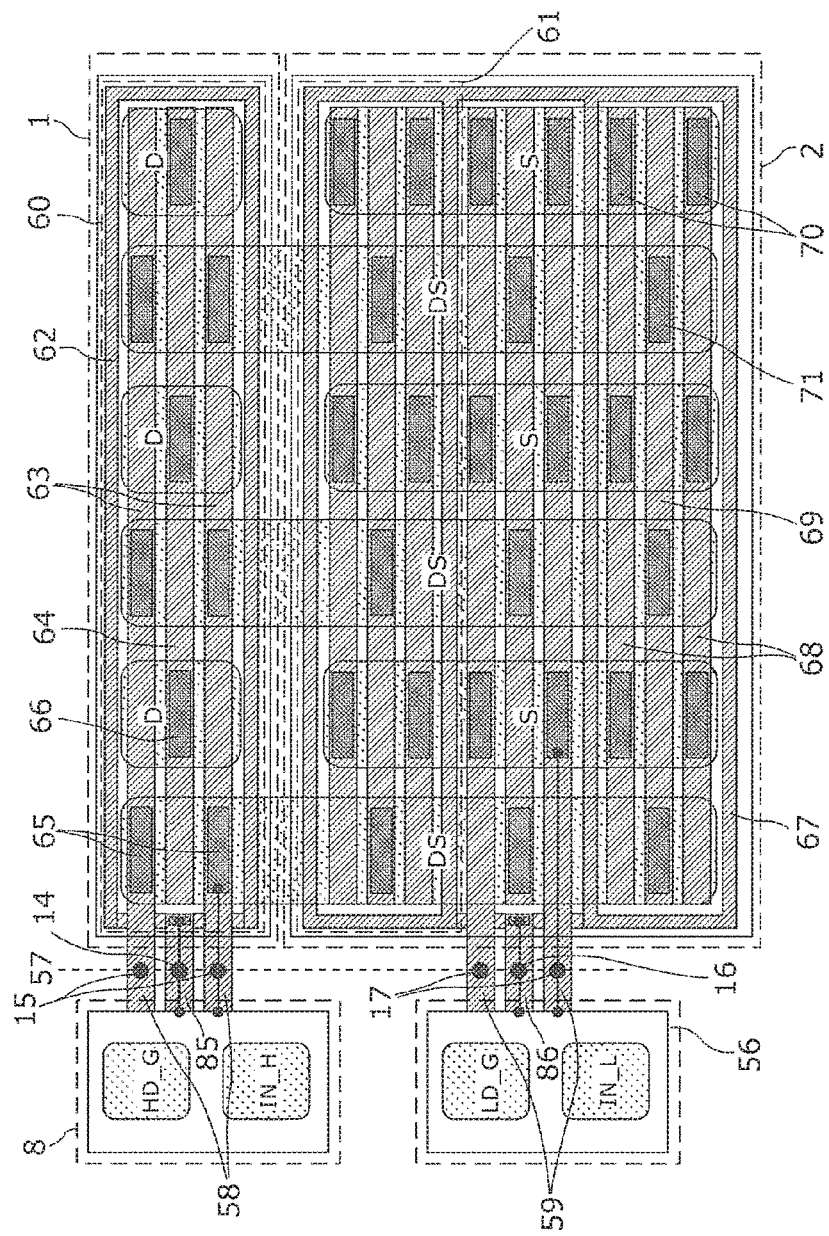
FIG. 7 is a plan view of a semiconductor device according to a modification example of the first exemplary embodiment.

In FIG. 7, the same components as those in the structures shown in FIG. 1A to FIG. 6B are given the same reference numerals to omit description thereof. A structure shown in FIG. 7 is the same as the structure as far as primary thick film wiring 34 (or 46) shown in FIG. 6A. In FIG. 7, the arrangement of via holes 65 and 66 in high side power FET 1 and the arrangement of via holes 70 and 71 in low side power FET 2 in FIG. 6A are exchanged respectively. Also, the position of the drain electrode pad D and the source electrode pad S and the position of the drain/source electrode pad are exchanged. In other words, in this arrangement, an electrode pad with the shortest distance to the gate driver is the drain/source electrode pad DS.

While in the arrangement shown in FIG. 7, wirings with the shortest distance can be used as wiring 14, wiring 15 and wiring 16, since source terminal 59 of low side gate driver 56 and the source electrode pad S are distant from each other, a parasitic inductance of wiring 17 is increased.

In other words, use of the arrangement shown in FIG. 6A enables reduction in a parasitic inductance of wiring 17. Use of the arrangement shown in FIG. 7 also enables reduction in a parasitic inductance of wiring 15.

Second Exemplary Embodiment

Figure 8:
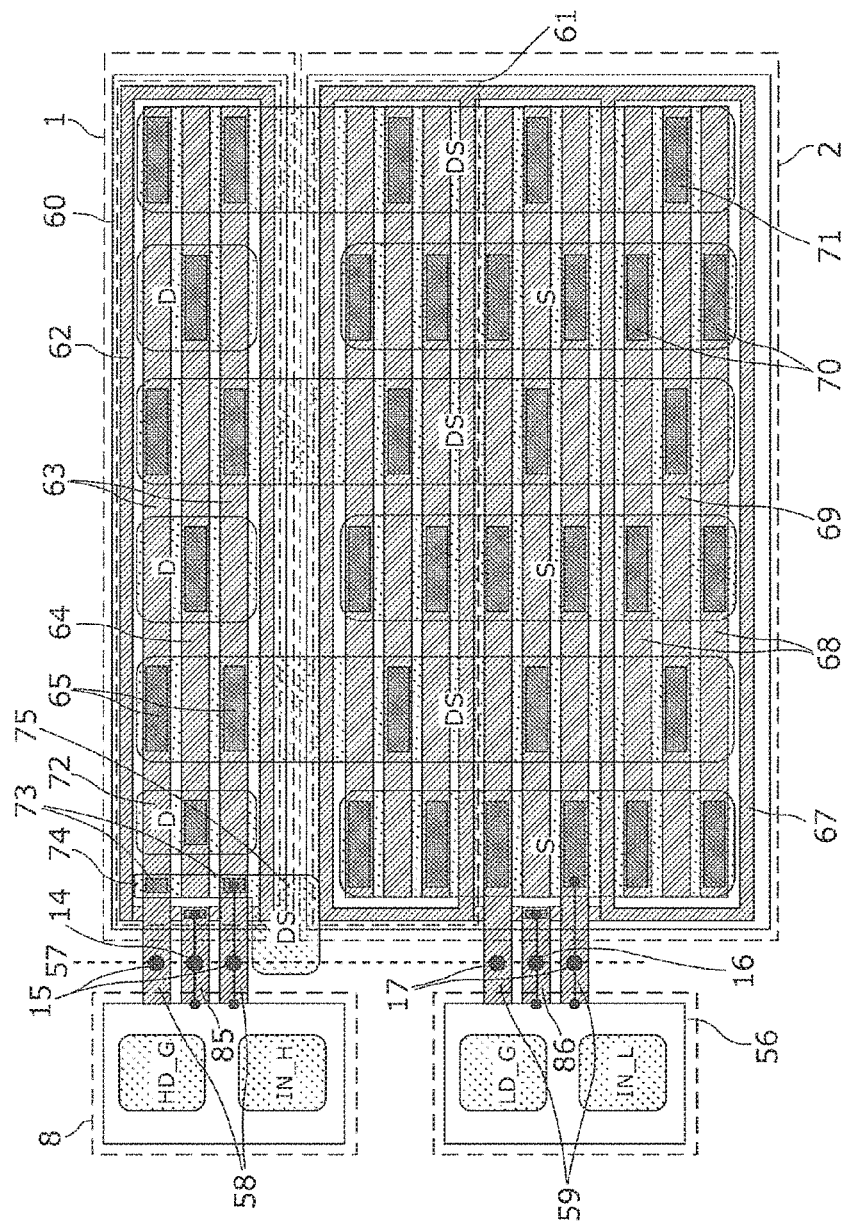
FIG. 8 is a plan view of a semiconductor device according to a second exemplary embodiment.

In the following, a semiconductor device according to a second exemplary embodiment will be described with reference to the accompanying drawings. In FIG. 8, the same components as those in the structures shown in FIG. 1A to FIG. 7 are given the same reference numerals to omit description thereof. A structure shown in FIG. 8 is the same as the structure as far as primary thick film wiring 34 (or 46) shown in FIG. 6A. The structure in FIG. 8, which has approximately the same electrode pad arrangement as in FIG. 6A, is different in having drain electrode pad 72 (first electrode pad) of high side power FET 1, which pad is disposed at the shortest distance from high side gate driver 8.

Drain electrode pad 72 is an electrode pad disposed at a position closest to high side gate driver 8 among the plurality of drain electrode pads D and the plurality of drain/source electrode pads DS that high side power FET 1 has.

Drain electrode pad 72 is formed to be as small as possible to an extent that the pad can be flip-chip mounted. On source lift-up wiring 63 in a free region on the left of drain electrode pad 72, via hole 73 is formed, and wiring 74 (source additional wiring) is formed with secondary thick film wiring 37. Since wiring 74 is not used for flip-chip mounting, the wire may be as thin as 100 μm or less.

A width of drain electrode pad 72 may be the same as a width of other drain electrode pad D. In this case, by setting a width of the source electrode pad S of low side power FET 2 disposed side by side with drain electrode pad 72 in a vertical direction (downward direction in FIG. 8) to be larger than widths of other electrode pads, a free region is provided on the immediate left of drain electrode pad 72.

Additionally, drain/source electrode pad 75 (second drain/source electrode pad) is provided in a free region between the gate driver region and the power FET region. This drain/source electrode pad 75 is connected to wiring 74. Although for suppressing a chip size, drain/source electrode pad 75 is preferably provided at a position as shown in FIG. 8, drain/source electrode pad 75 may be disposed in an upper portion (upward direction in FIG. 8) of high side power FET 1.

Modification Example of Second Exemplary Embodiment

Figure 9:
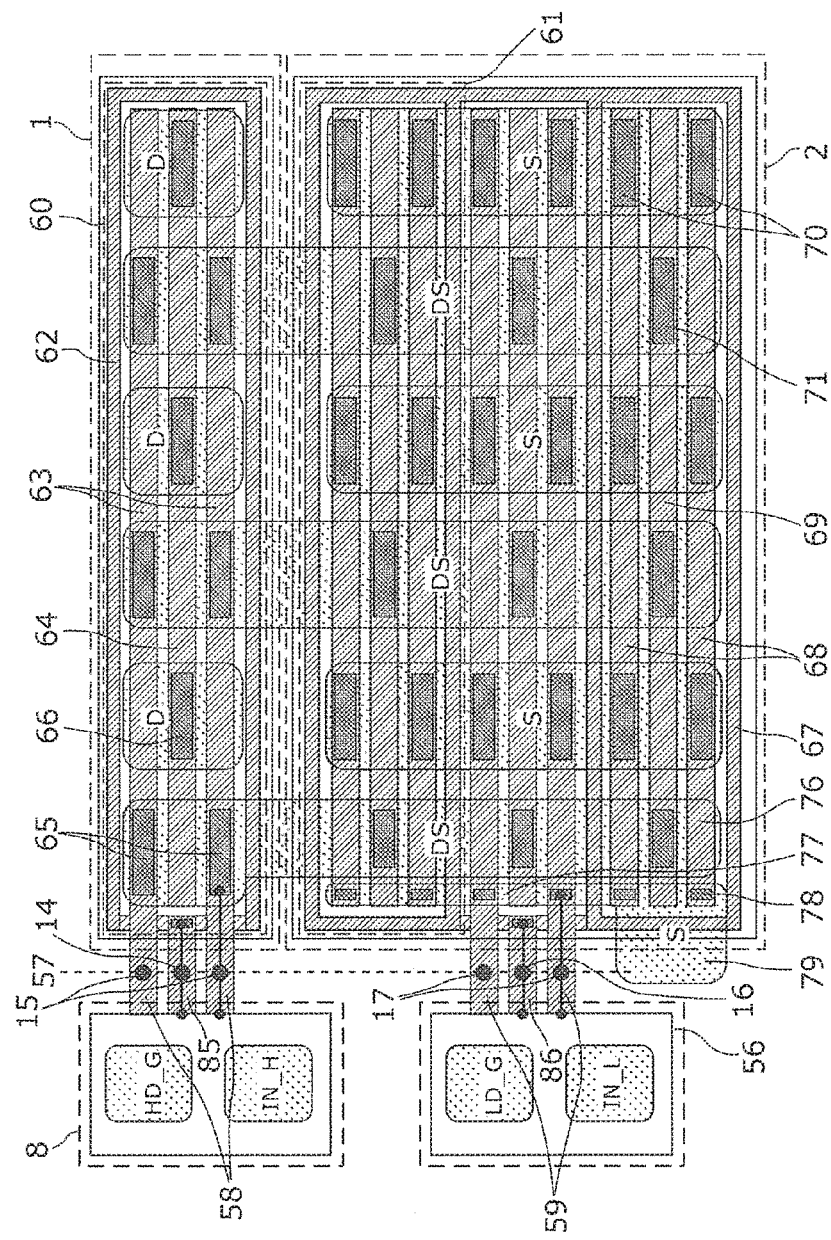
FIG. 9 is a plan view of a semiconductor device according to a modification example of the second exemplary embodiment.

In the following, a semiconductor device according to a modification example of the second exemplary embodiment will be described with reference to the accompanying drawings. In FIG. 9, the same components as those in the structures shown in FIG. 1A to FIG. 8 are given the same reference numerals to omit description thereof. A structure shown in FIG. 9 is the same as the structure as far as primary thick film wiring 34 (or 46) shown in FIG. 7. The structure in FIG. 9, which has approximately the same electrode pad arrangement as in FIG. 7, is different in having drain/source electrode pad 76 (first electrode pad) of low side power FET 2, which pad is disposed at the shortest distance from low side gate driver 56.

Drain/source electrode pad 76 is an electrode pad disposed at a position closest to high side gate driver 8 among the plurality of drain electrode pads D and the plurality of drain/source electrode pads DS disposed on high side power FET 1. Additionally, drain/source electrode pad 76 is an electrode pad disposed at a position closest to low side gate driver 56 among the plurality of source electrode pads S and the plurality of drain/source electrode pads DS disposed on low side power FET 2.

Drain/source electrode pad 76 on low side power FET 2 is formed to be as small as possible to an extent that the pad can be flip-chip mounted. Shared drain/source electrode pad DS on high side power FET 1 is formed so as to be as close as possible to high side gate driver 8 similarly to FIG. 7. On source lift-up wiring 68 in a free region on the left of drain/source electrode pad 76, via hole 78 is formed, and wiring 77 (source additional wiring) is formed with secondary thick film wiring 37. Since wiring 77 is not used for flip-chip mounting, the wire may be as thin as 100 μm or less.

A width of drain/source electrode pad 76 on low side power FET 2 may be the same as a width of other drain/source electrode pad DS. In this case, by setting a width of the drain/source electrode pad DS on high side power FET 1 to be larger than widths of other electrode pads, a free region is provided on the immediate left of drain/source electrode pad 76 on low side power FET 2.

Additionally, source electrode pad 79 (third source electrode pad) is provided in a free region between the gate driver region and the power FET region. This source electrode pad 79 is connected to wiring 77.

Figure 10:
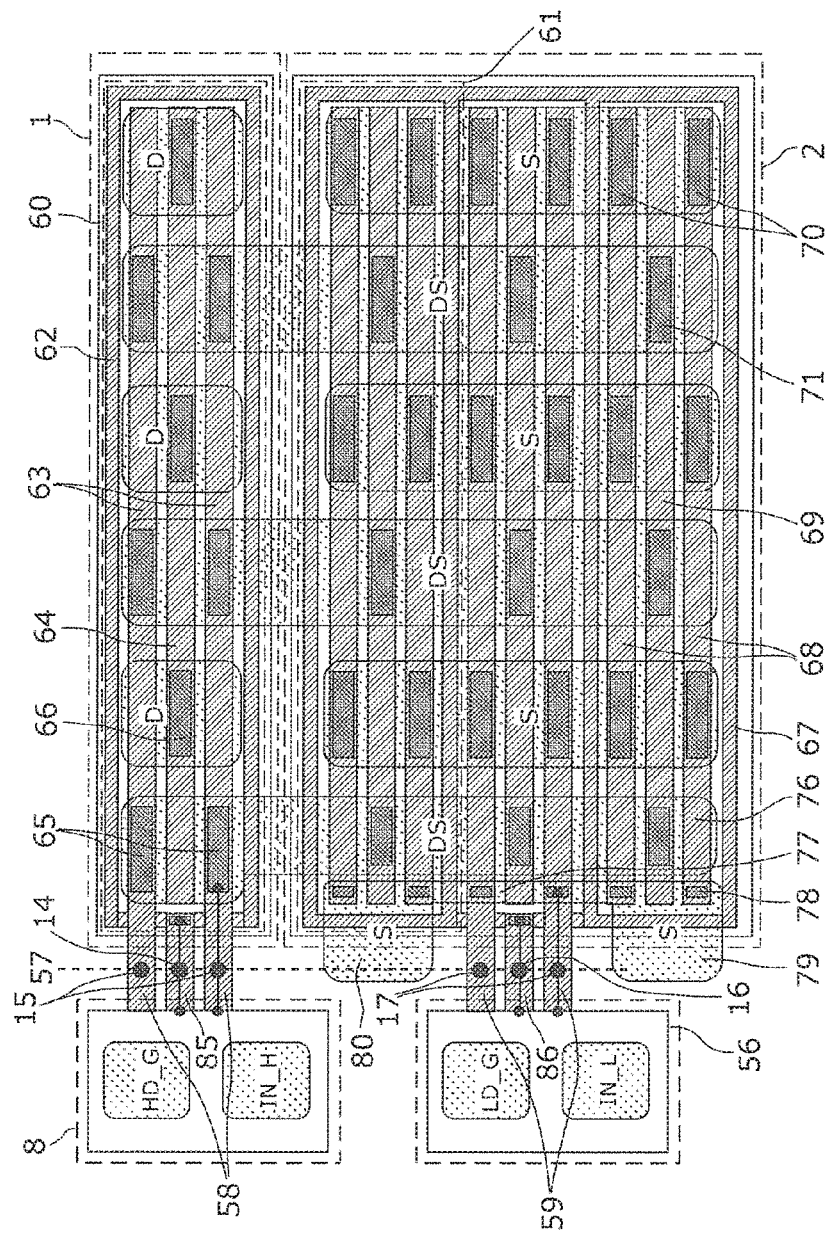
FIG. 10 is a plan view of another example of the semiconductor device according to the modification example of the second exemplary embodiment.

As shown in FIG. 10, source electrode pad 80 (fourth source electrode pad) may be formed in an upper portion (upward direction in FIG. 10) of low side power FET 2. The source electrode pad 80 is formed using secondary thick film wiring 37. Additionally, source electrode pad 79 and source electrode pad 80 may be formed simultaneously when there is a region where the pads can be disposed without increasing a chip size. In this case, this source electrode pad 80 is connected to source electrode pad 79 via wiring 77. Additionally, only one of source electrode pad 79 and source electrode pad 80 may be formed.

Third Exemplary Embodiment

Figure 11:
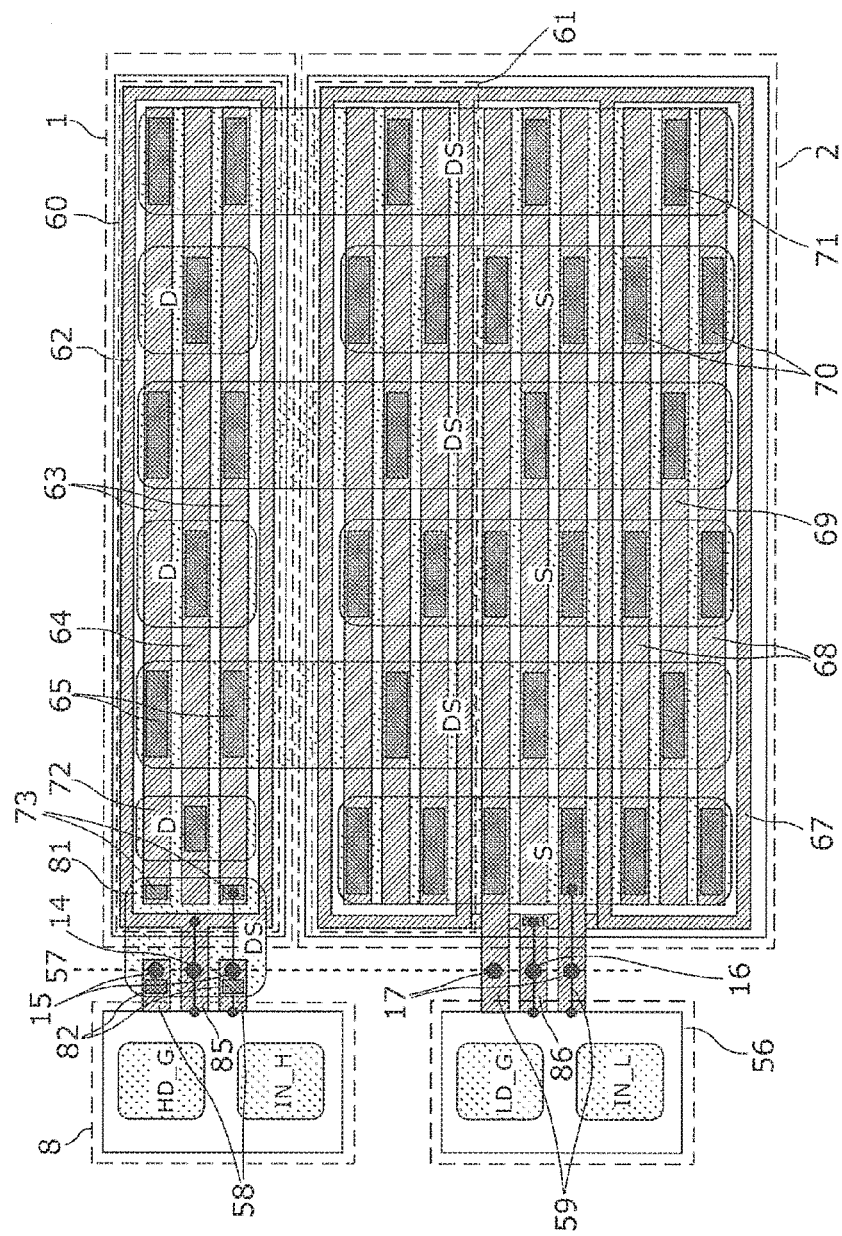
FIG. 11 is a plan view of a semiconductor device according to a third exemplary embodiment.

In the following, a semiconductor device according to a third exemplary embodiment will be described with reference to the accompanying drawings. In FIG. 11, the same components as those in the structures shown in FIG. 1A to FIG. 10 are given the same reference numerals to omit description thereof. In FIG. 11, source terminal 58 of high side gate driver 8 is not connected to source lift-up wiring 63 of high side power FET 1, but is formed as far as boundary 57. Output terminal 85 of high side gate driver 8 is connected to gate lift-up wiring 62 of high side power FET 1.

In the configurations shown in FIG. 7 to FIG. 10, on one side of gate lift-up wiring 62 facing high side gate driver 8, primary thick film wiring 34 (or 46) is removed and only the gate electrode formed with the thin film wiring layer is disposed. However, in the present exemplary embodiment, on all the four sides, primary thick film wiring 34 (or 46) is formed. Additionally, this gate lift-up wiring 62 is connected to output terminal 85.

A layout structure of low side gate driver 56 and low side power FET 2 is the same as that of FIG. 6A.

Drain electrode pad 72 has a pad width which enables a region to be ensured on the left of drain electrode pad 72 similarly to that shown in FIG. 8. On source lift-up wiring 63 in the free region, via hole 73 is formed, and wiring 81 is formed with secondary thick film wiring 37. This wiring 81 is formed so as to overlap source terminal 58 of high side gate driver 8, the terminal being formed as far as boundary 57. Wiring 81 is connected to source terminal 58 via via hole 82. Additionally, wiring 81 is used as an electrode pad for flip-chip mounting.

In other words, wiring 81 is a first electrode pad disposed at a position closest to high side gate driver 8 among the plurality of drain electrode pads D and the plurality of drain/source electrode pads DS that high side power FET 1 has. Additionally, source terminal 58 of high side gate driver 8 is connected to source lift-up wiring 63 via wiring 81.

In this configuration, forming all the four sides of gate lift-up wiring 62 with primary thick film wiring 34 (or 46) enables reduction in a gate resistance of high side power FET 1.

Modification Example of Third Exemplary Embodiment

Figure 12:
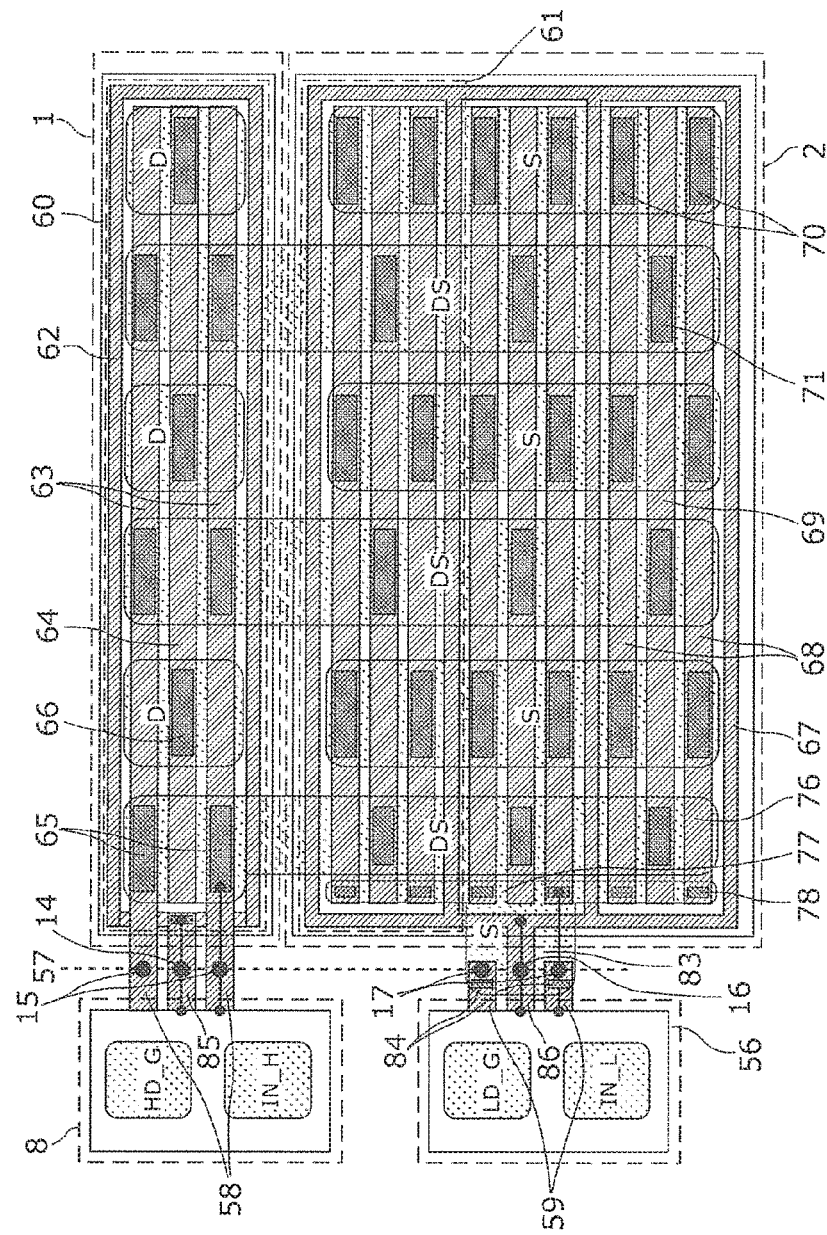
FIG. 12 is a plan view of a semiconductor device according to a modification example of the third exemplary embodiment.

In the following, a semiconductor device according to a modification example of the third exemplary embodiment will be described with reference to the accompanying drawings. In FIG. 12, the same components as those in the structures shown in FIG. 1A to FIG. 11 are given the same reference numerals to omit description thereof. In FIG. 12, source terminal 59 of low side gate driver 56 is not connected to source lift-up wiring 68 of low side power FET 2 but is formed as far as boundary 57. Output terminal 86 of low side gate driver 56 is connected to gate lift-up wiring 67 of low side power FET 2.

In the configurations shown in FIG. 7 to FIG. 11, on one side of gate lift-up wiring 67 facing low side gate driver 56, primary thick film wiring 34 (or 46) is removed and only the gate electrode formed with the thin film wiring layer is disposed. However, in the modification example of the present exemplary embodiment, on all the four sides, primary thick film wiring 34 (or 46) is formed. Additionally, this gate lift-up wiring 67 is connected to output terminal 86.

A layout structure of high side gate driver 8 and high side power FET 1 is the same as that of FIG. 6A.

Dain/source electrode pad 76 has a pad width which enables a region to be ensured on the left of drain/source electrode pad 76 similarly to that shown in FIG. 9. On source lift-up wiring 68 in the free region, via hole 78 is formed, and wiring 83 is formed with secondary thick film wiring 37. This wiring 83 is formed so as to overlap source terminal 59 of low side gate driver 56, the terminal being formed as far as boundary 57. Wiring 83 is connected to source terminal 59 via via hole 84. Additionally, wiring 83 is used as an electrode pad for flip-chip mounting.

In other words, wiring 83 is a second electrode pad disposed at a position closest to low side gate driver 56 among the plurality of source electrode pads S and the plurality of drain/source electrode pads DS that low side power FET 2 has. Additionally, source terminal 59 of low side gate driver 56 is connected to source lift-up wiring 68 via wiring 83.

In this configuration, forming all the four sides of gate lift-up wiring 67 with primary thick film wiring 34 (or 46) enables reduction in a gate resistance of low side power FET 2.

Although the semiconductor device according to the exemplary embodiments of the present disclosure has been described in the foregoing, the present disclosure is not limited to these exemplary embodiments.

For example, a gate length (Lg) of a gate electrode, a source electrode length (Ls), a drain electrode length (Ld), a distance between a gate and a source (Lgs), a distance between a gate and a drain (Lgd), and a gate width (Wg), all of which configure a transistor shown in the above description, are each one example only and may have any value.

Additionally, each electrode or wiring, or a dielectric layer may have any value of a thickness.

Additionally, in the above description, two thick film wiring layers are used; however, a thick film wiring layer including two or more layers may be used.

Additionally, in the above description, an AlGaN/GaN based FET is used as a power semiconductor element; however, the power semiconductor element is not limited thereto. For example, the power semiconductor element may be an FET using Si as a constituent material, an FET using SiC as a constituent material, an FET using SiGe or SiGeC as a material, or an FET using III-V group compound such as GaAs or AlGaAs as a material.

Additionally, compositions of AlGaN and GaN may be appropriately selected. Additionally, an FET may be other FET than those described above. For example, an FET may be a hetero-junction field-effect transistor (HFET), a junction type field-effect transistor (JFET), an MOSFET or a gate insulation film transistor (MISFET).

Additionally, as a power semiconductor element, a bipolar transistor, an IGBT or the like may be used other than FETs.

Additionally, the above-described plan views, sectional views and the like are views schematically showing the configurations according to the present disclosure. In other words, in each of the above views, corner portions and sides of each component are illustrated linearly; however, corner portions and sides rounded for manufacturing reasons are also included in the present disclosure.

Additionally, the circuit configurations shown in the above circuit diagrams are each one example and the present disclosure is not limited to the above circuit configurations. In other words, similar to the above circuit configurations, a circuit that can realize characteristic functions of the present disclosure is also included in the present disclosure. For example, it is also included in the present disclosure to connect such an element as a switching element (transistor), a resistance element, or a capacitance element to a certain element in series or in parallel within a range that can realize the same functions as those obtained by the above circuit configurations. In other words, "being connected" in the above exemplary embodiments is not limited to direct connection of two terminals (nodes), but also includes the two terminals (nodes) being connected via an element within a range that can realize the same functions.

Additionally, the numerical figures used above are all illustrative only for specific description of the present disclosure, and the present disclosure is not limited to the illustrated numerical figures. Further, a logic level represented by high/low or a switching state represented by on/off is illustrative only for specific description of the present disclosure, and a different combination of the illustrated logic levels or switching states can obtain equivalent results. Further, the above-described configuration of the logic circuit is illustrative only for specific description of the present disclosure and an equivalent input/output relation can be realized by a logic circuit of a different configuration. Additionally, all the above-described materials of the components are illustrative only for specific description of the present disclosure and materials are not limited to those illustrated in the present disclosure. Additionally, the connection relation between the components is illustrative only for specific description of the present disclosure and a connection relation that realizes the functions of the present disclosure is not limited thereto.

Although the semiconductor device according to one or a plurality of aspects has been described based on the exemplary embodiments in the foregoing, the present disclosure is not limited to the above-described exemplary embodiments. Various modifications those skilled in the art can appreciate may be made in the present exemplary embodiments, and modes set up by combining the components in the different exemplary embodiments may be included in a range of one or a plurality of aspects without departing from the gist of the present disclosure.

Since the semiconductor device according to the present disclosure enables reduction of a power loss due to a parasitic inductance generated when the gate driver and the power semiconductor element are connected, the device is useful for a power conversion circuit such as a DC-DC converter.

What is claimed is:
1. A semiconductor device comprising:
a semiconductor layer laminate, a first gate driver and a second gate driver each including a depression type transistor as a field-effect transistor and a first enhancement type transistor as a field-effect transistor, and
a first power transistor and a second power transistor as field-effect transistors, wherein
a source terminal of the first power transistor and a drain terminal of the second power transistor are connected,
a drain terminal of the first power transistor is connected to a power supply,
a source terminal of the second power transistor is grounded,
an output terminal of the first gate driver is connected to a gate terminal of the first power transistor,
a ground terminal of the first gate driver is connected to the source terminal of the first power transistor,
an output terminal of the second gate driver is connected to a gate terminal of the second power transistor,
a ground terminal of the second gate driver is connected to the source terminal of the second power transistor,
the first gate driver, the second gate driver, the first power transistor and the second power transistor are integrated in the same chip,
a first insulation layer formed on the first gate electrode, the first source electrode, the first drain electrode, the second gate electrode, the second source electrode and the second drain electrode,
a first wiring layer formed on the first insulation layer,
a plurality of first via holes which are formed in the first insulation layer and which connect the first gate electrode, the first source electrode, the first drain electrode, the second gate electrode, the second source electrode and the second drain electrode with the first wiring layer,
a second insulation layer formed on the first wiring layer,
a second wiring layer formed on the second insulation layer, and
a plurality of second via holes which are formed in the second insulation layer and which connect the first wiring layer with the second wiring layer,
wherein the first power transistor includes:
  a third gate electrode, a third source electrode and a third drain electrode which are formed on the semiconductor layer laminate,
  a first drain lift-up wiring formed using the first wiring layer and connected to the third drain electrode via any of the plurality of first via holes,
  a first source lift-up wiring formed using the first wiring layer and connected to the third source electrode via any of the plurality of first via holes, and
  a first gate lift-up wiring formed using the first wiring layer and connected to the third gate electrode via any of the plurality of first via holes,
wherein the first drain lift-up wiring and the first source lift-up wiring extend in parallel to each other in a first direction, and
the first gate lift-up wiring is formed so as to surround the first drain lift-up wiring and the first source lift-up wiring,
the first power transistor further includes:
  a plurality of first drain electrode pads formed using the second wiring layer and connected to the first drain lift-up wiring via any of the plurality of second via holes, and
  a plurality of first source electrode pads formed using the second wiring layer and connected to the first source lift-up wiring via any of the plurality of second via holes,
wherein the plurality of first drain electrode pads and the plurality of first source electrode pads are alternately disposed side by side in the first direction, and
the second power transistor includes:
  a fourth gate electrode, a fourth source electrode and a fourth drain electrode which are formed on the semiconductor layer laminate,
  a second drain lift-up wiring formed using the first wiring layer and connected to the fourth drain electrode via any of the plurality of first via holes,
  a second source lift-up wiring formed using the first wiring layer and connected to the fourth source electrode via any of the plurality of first via holes, and
  a second gate lift-up wiring formed using the first wiring layer and connected to the fourth gate electrode via any of the plurality of first via holes,
wherein the second drain lift-up wiring and the second source lift-up wiring extend in parallel to each other in the first direction, and
the second gate lift-up wiring is formed so as to surround the second drain lift-up wiring and the second source lift-up wiring, and
the second power transistor further includes:
  a plurality of second drain electrode pads formed using the second wiring layer and connected to the second drain lift-up wiring via any of the plurality of second via holes, and
  a plurality of second source electrode pads formed using the second wiring layer and connected to the second source lift-up wiring via any of the plurality of second via holes, and
wherein the plurality of second drain electrode pads and the plurality of second source electrode pads are alternately disposed side by side in the first direction, and
the plurality of first source electrode pads and the plurality of second drain electrode pads correspond one to one, the corresponding first source electrode pad and second drain electrode pad being connected to configure a single first drain/source electrode pad.

2. The semiconductor device according to claim 1, wherein
a drain terminal of the depression type transistor of the first gate driver is connected to the power supply,
a drain terminal of the depression type transistor of the second gate driver is connected to the power supply,
a gate terminal and a source terminal of the depression type transistor of the first gate driver, and a drain terminal of the first enhancement type transistor of the first gate driver are connected to the output terminals of the first gate driver,
a gate terminal and a source terminal of the depression type transistor of the second gate driver, and a drain terminal of the first enhancement type transistor of the second gate driver are connected to the output terminals of the second gate driver,
a source terminal of the first enhancement type transistor of the first gate driver is connected to a source terminal of the first power transistor and a drain terminal of the second power transistor, and
a source terminal of the first enhancement type transistor of second gate driver is connected to a source terminal of the second power transistor.

3. The semiconductor device according to claim 1, wherein
each of the first gate driver and the second gate driver further includes a second enhancement type transistor and a third enhancement type transistor,
in each of the first gate driver and the second gate driver,
a drain terminal of the depression type transistor is connected to the power supply,
a gate terminal and a source terminal of the depression type transistor, a drain terminal of the first enhancement type transistor, and a gate terminal of the second enhancement type transistor are connected,
a gate terminal of the third enhancement type transistor and a gate terminal of the first enhancement type transistor are connected,
a source terminal of the second enhancement type transistor and a drain terminal of the third enhancement type transistor are connected to each of the output terminals of the first gate driver and the second gate driver, respectively,
a drain terminal of the second enhancement type transistor is connected to the power supply, and
a source terminal of the first enhancement type transistor and a source terminal of the third enhancement type transistor are connected to each of the ground terminals of the first gate driver and the second gate driver, respectively.

4. The semiconductor device according to claim 1, comprising:
a first gate electrode, a first source electrode and a first drain electrode of the depression type transistor which are formed on the semiconductor layer laminate, and
a second gate electrode, a second source electrode and a second drain electrode of the first enhancement type transistor which are formed on the semiconductor layer laminate.

5. The semiconductor device according to claim 4, wherein each of the first gate driver and the second gate driver includes:
a signal input pad connected to the gate terminal of the first enhancement type transistor,
a power application pad connected to the drain terminal of the depression type transistor,
a signal output wiring formed using the first wiring layer and corresponding to each of the output terminals of the first gate driver and the second gate driver, respectively, and
a source terminal wiring formed using the first wiring layer and corresponding to each of the ground terminals of the first gate driver and the second gate driver, respectively.

6. The semiconductor device according to claim 1, wherein
the signal output wiring of the first gate driver is connected to the first gate lift-up wiring,
the source terminal wiring of the first gate driver is connected to the first source lift-up wiring,
the signal output wiring of the second gate driver is connected to the second gate lift-up wiring, and
the source terminal wiring of the second gate driver is connected to the second source lift-up wiring.

7. The semiconductor device according to claim 6, wherein
among the plurality of first drain electrode pads and a plurality of the first drain/source electrode pads, a first electrode pad disposed at a position closest to the first gate driver is the first drain electrode pad, the semiconductor device further comprising:
a source additional wiring formed using the second wiring layer at a position closer to the first gate driver than to the first electrode pad and connected to the first source lift-up wiring via any of the second via holes, and
a second drain/source electrode pad formed using the second wiring layer and connected to the source additional wiring.

8. The semiconductor device according to claim 6, wherein
among the plurality of first drain electrode pads and a plurality of the first drain/source electrode pads, a first electrode pad disposed at a position closest to the first gate driver is the first drain/source electrode pad,
among the plurality of second source electrode pads and the plurality of first drain/source electrode pads, an electrode pad disposed at a position closest to the second gate driver is the first drain/source electrode pad as the first electrode pad, and
the first electrode pad on the first power transistor has a width in the first direction larger than a width, in the first direction, of the first electrode pad on the second power transistor and is formed using the second wiring layer at a position closer to the second gate driver than to the first electrode pad,
a source additional wiring connected to the second source lift-up wiring via any of the second via holes, and
a third source electrode pad formed using the second wiring layer and connected to the source additional wiring.

9. The semiconductor device according to claim 8, further comprising a fourth source electrode pad formed using the second wiring layer and connected to the third source electrode pad via the source additional wiring.

10. The semiconductor device according to claim 1, wherein
the signal output wiring of the first gate driver is connected to the first gate lift-up wiring, and
the signal output wiring of the second gate driver is connected to the second gate lift-up wiring.

11. The semiconductor device according to claim 10, wherein
among the plurality of first drain electrode pads and the plurality of first drain/source electrode pads, a first electrode pad disposed at a position closest to the first gate driver is the first drain/source electrode pad, and
the source terminal wiring of the first gate driver is connected to the first source lift-up wiring via the first electrode pad.

12. The semiconductor device according to claim 10, wherein
among the plurality of second source electrode pads and the plurality of first drain/source electrode pads, a second electrode pad disposed at a position closest to the second gate driver is the second source electrode pad, and
the source terminal wiring of the second gate driver is connected to the second source lift-up wiring via the second electrode pad.

13. The semiconductor device according to claim 1, wherein the depression type transistor, the first enhancement type transistor, the first power transistor and the second power transistor are each configured with a nitride semiconductor.

14. The semiconductor device according to claim 4, further comprising a p-type semiconductor layer formed between the second gate electrode and the semiconductor layer laminate.

* * * * *